United States Patent [19]

Hoffman et al.

[11] 4,103,417

[45] Aug. 1, 1978

[54] WIRE STRINGING DEVICE

[75] Inventors: Richard Ernest Hoffman; Maximiliaan Bruckner, both of San Jose, Calif.

[73] Assignee: Dataproducts (Santa Clara), Inc., Santa Clara, Calif.

[21] Appl. No.: 827,466

[22] Filed: Aug. 25, 1977

[51] Int. Cl.² .............................................. H01F 41/08
[52] U.S. Cl. ...................................... 29/737; 29/241; 29/433; 29/604
[58] Field of Search ................ 29/737, 604, 241, 433; 340/174 MA

[56] References Cited

U.S. PATENT DOCUMENTS

| | | | |
|---|---|---|---|
| 3,314,131 | 4/1967 | Judge | 29/737 X |
| 3,694,913 | 10/1972 | Draving et al. | 29/737 X |
| 3,792,527 | 2/1974 | Krag et al. | 29/604 |
| 4,047,288 | 9/1977 | Burkin | 29/737 X |

Primary Examiner—Carl E. Hall

[57] ABSTRACT

A device for stringing a multiplicity of wires through a memory array in a plurality of directions having means for guiding the wires into the array and for capturing the wires leaving the array and means for providing tension on the wires and for directing and causing the wires to pass through the array in the plurality of directions. The guiding and capture means are adapted both to constrain the wires in a preselected configuration and to permit the wires to be easily removed therefrom.

10 Claims, 7 Drawing Figures

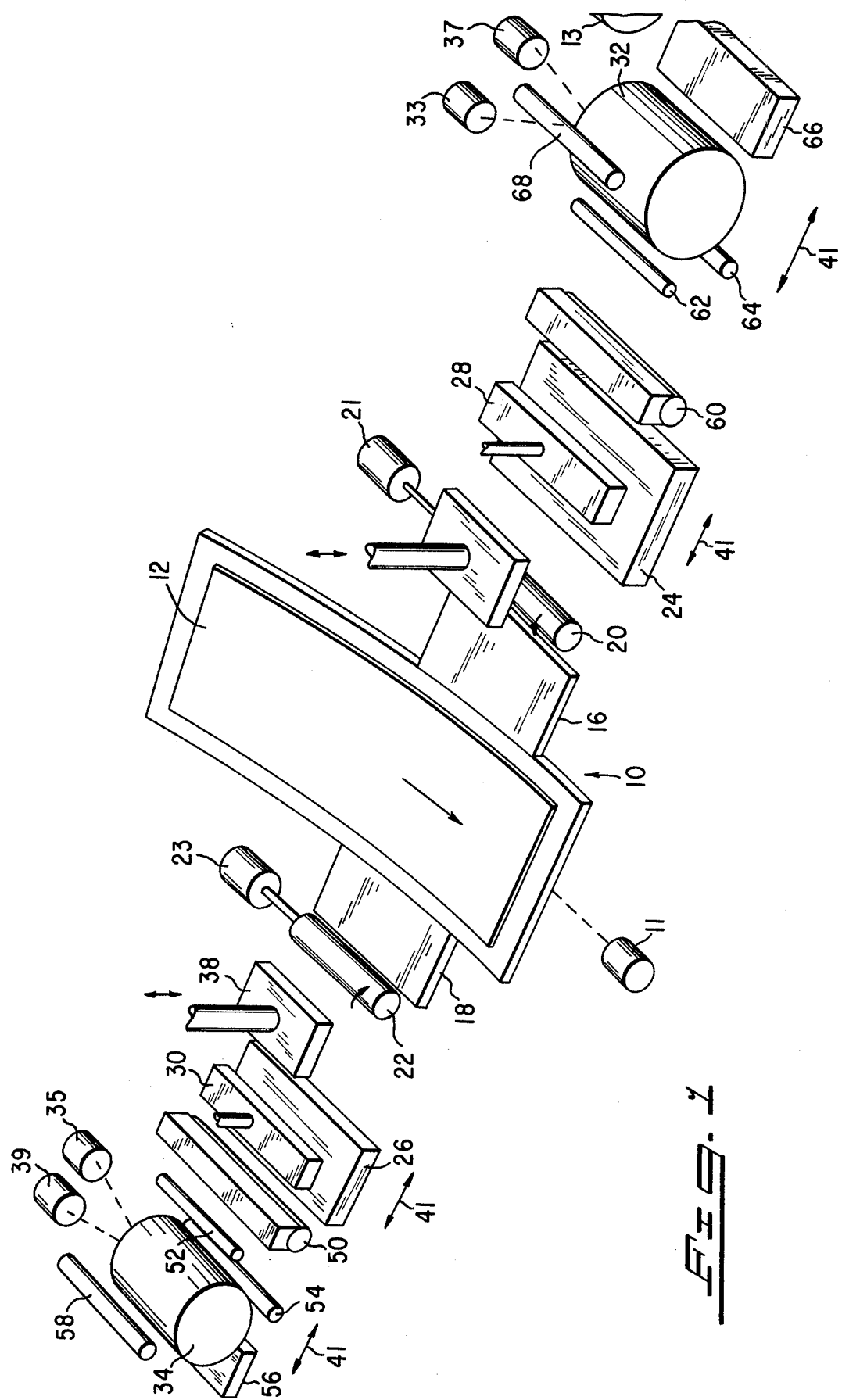

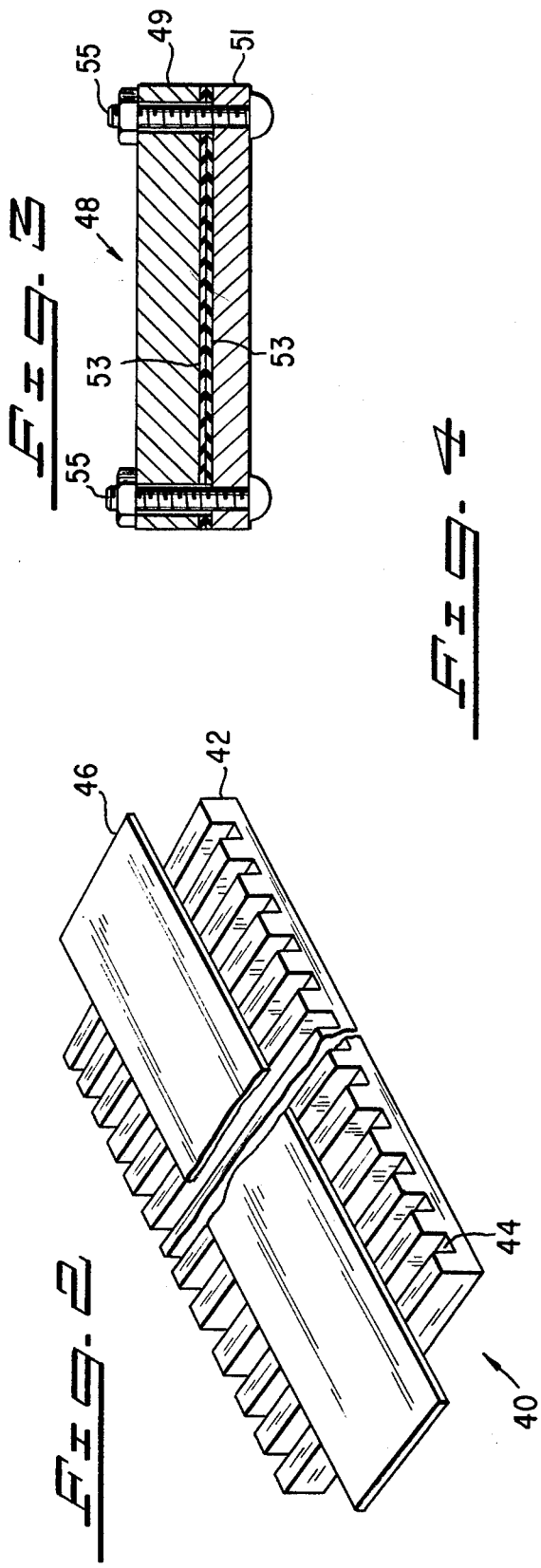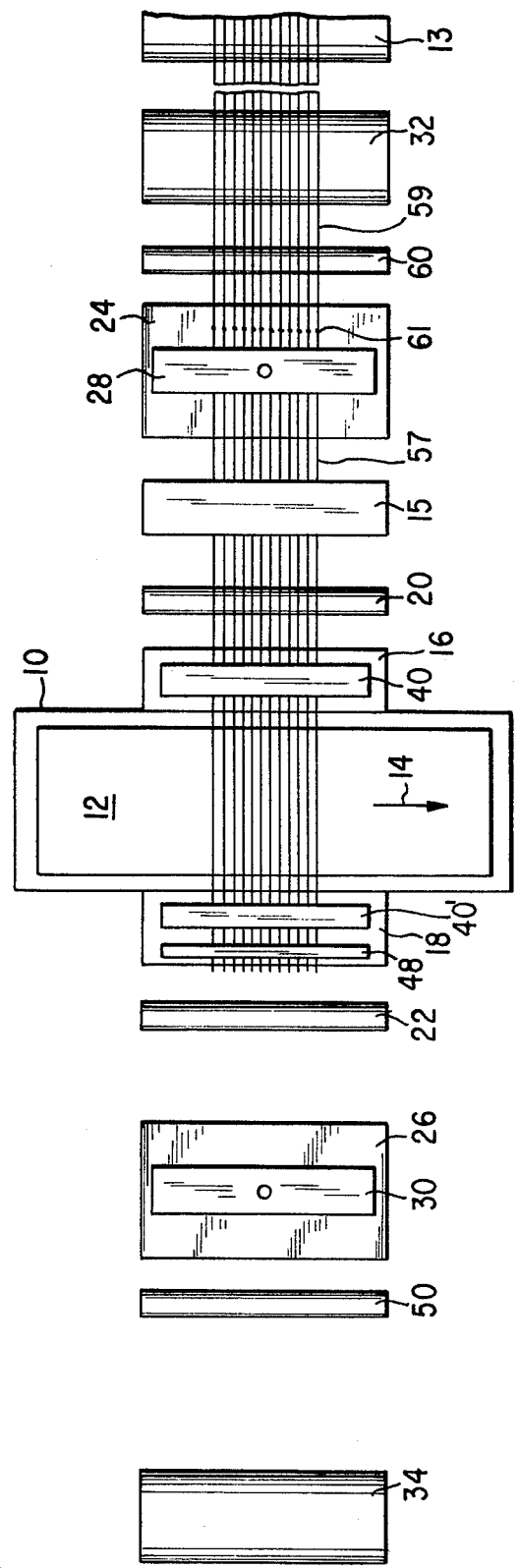

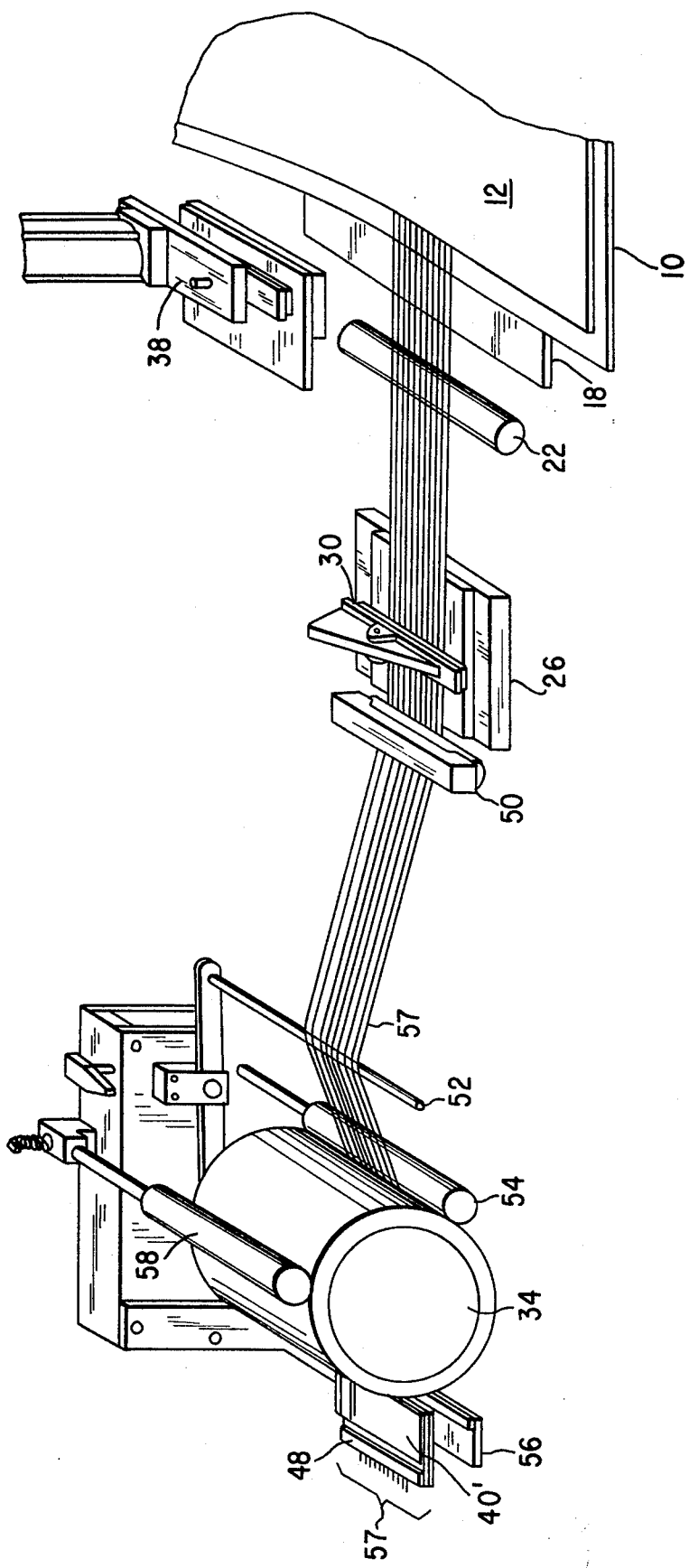

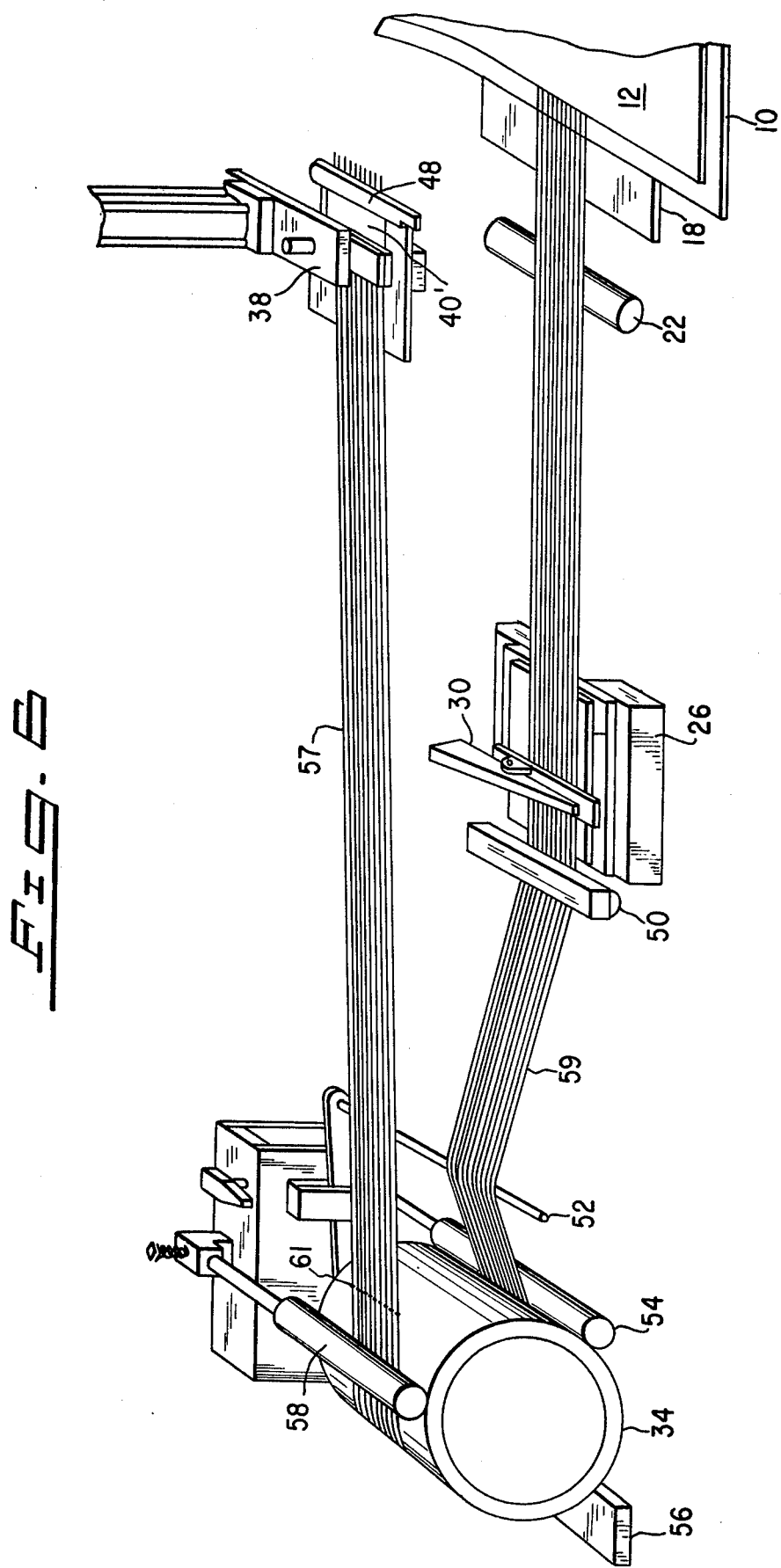

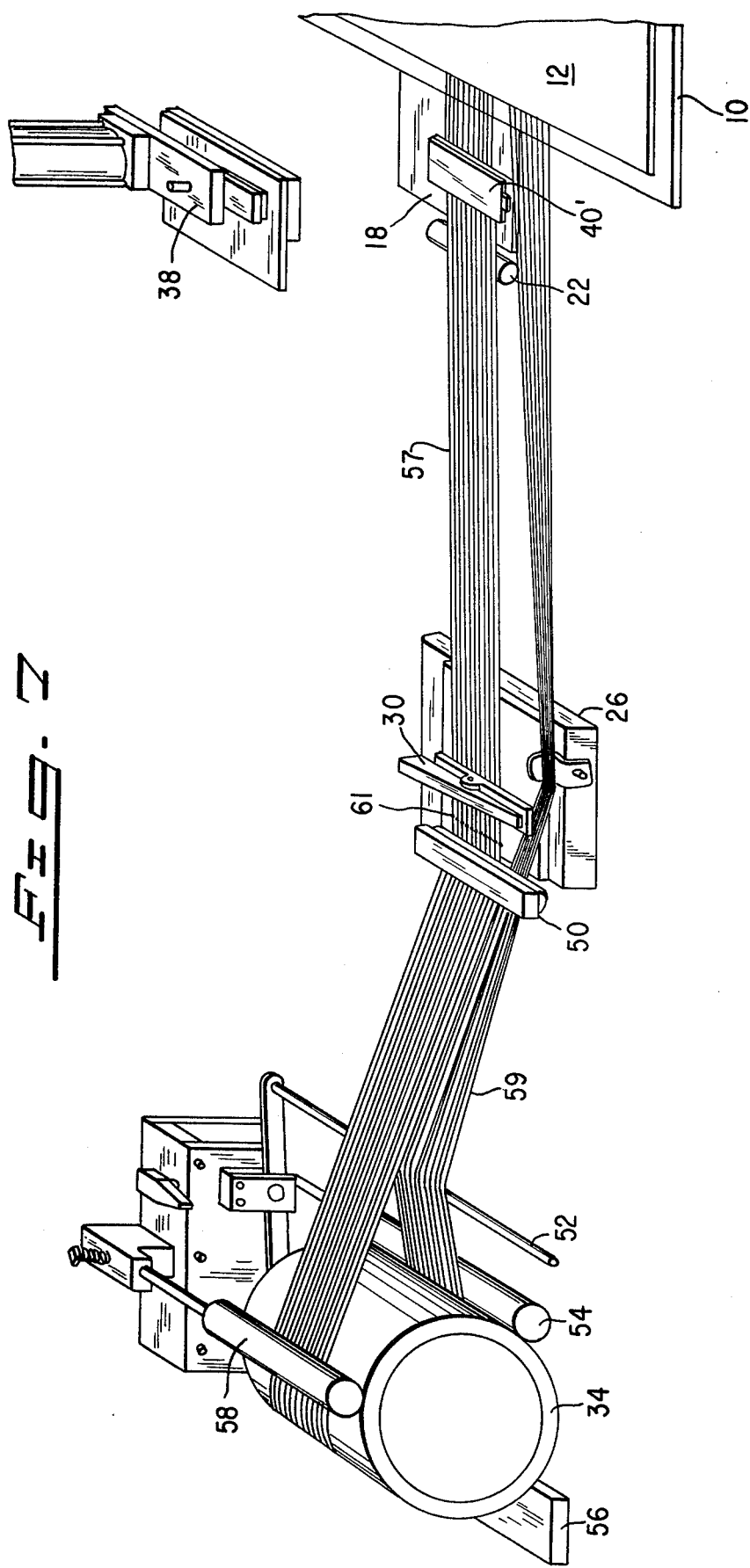

WIRE STRINGING DEVICE

BACKGROUND OF THE INVENTION

1. Field of the Invention

The invention relates in general to the field of memory arrays and, in particular, to apparatus and methods for stringing wires through such memory arrays.

2. Prior Art

Memory arrays, especially memory arrays comprising a plurality of ferrite cores, have become an extremely important part of modern computer and processing technology. These arrays which contain hundreds of thousands of ferrite cores must have wires strung therethrough in order to write information into and read information out of the array. In a typical array the cores are arranged in rows and columns and are placed on edge at a 45° angle to the longitudinal and transverse directions of the rows and columns. Wires are then strung through the cores in the directions of the rows and columns in order to be able to change the direction of magnetization of a particular core, and store, or write, data in the core and to be able to read data out of the core by determining the direction of magnetization of the core.

Because of the extremely large number of cores involved in the array, it is desirable to be able to automate, as much as possible, the wiring of the array in order to reduce the cost of producing such array. Many stringing devices have been developed which are capable of driving the wires straight through the core arrays and then terminating the wires after they exit from the array. In a number of arrays, however, the wires leaving from a section of the array must be redirected back into another section of the array, as, for example, an adjacent section in the opposite direction, in a weaving pattern, with eight or more feet of wire being needed to accomplish the total wiring free of kinks or tangles. It has been found, however, that the stringing devices currently being used are not capable of handling the above type of weaving pattern and the stringing of cores with such a weaving pattern has remained to present a hand task.

Accordingly, it is a general object of the present invention to provide an improved stringing device.

It is another object of the present invention to provide a stringing device which can string a multiplicity of wires through an array in a plurality of directions.

It is yet another object of the present invention to provide a stringing device which can string a continuously turning multiplicity of wires having an extremely long length and maintain them free of kinks or tangles.

SUMMARY OF THE INVENTION

A device for stringing a multiplicity of wires through a memory array in a plurality of directions is provided. The device has means for guiding the wires into the array and for capturing the wires leaving the array. Means are provided for keeping tension on the wires and for directing and causing the wires to pass through the array in the plurality of directions. The guiding and capture means are adapted both to constrain the wires in a preselected configuration and to permit the wires to be easily removed.

The novel features which are believed to be characteristic of the invention, both as to its organization and its method of operation, together with further objects and advantages thereof, will be better understood from the following description in connection with the accompanying drawings in which a presently preferred embodiment of the invention is illustrated by way of example. It is to be expressly understood, however, that the drawings are for purposes of illustration and description only and are not intended as a definition of the limits of the invention.

BRIEF DESCRIPTION OF THE DRAWINGS

FIG. 1 is a diagrammatic perspective view of a preferred embodiment of the wire stringer of the present invention.

FIG. 2 is a perspective view of the capture and guide plate used in the present invention.

FIG. 3 is an end view of the needle clamp used in the present invention.

FIG. 4 is a simplified plan view of the invention showing the wires in an initial stage of stringing.

FIGS. 5-7 are perspective views of a portion of the invention showing the wires in successive stages of the stringing operation.

DETAILED DESCRIPTION OF THE DRAWINGS

In FIG. 1 a preferred embodiment of the present invention is illustrated. The wire stringer includes a concave jig 10 upon which is mounted a core mat 12. The core mat 12 comprises, for example, a flexible, plastic substrate to which is affixed a plurality of rows and columns of ferrite cores set on edge at a 45° angle to the longitudinal and transverse directions of the rows and columns. The core mat 12 used in the present invention has been previously strung with 3 mil copper wire running in the direction of the arrow 14, the cores generally being 18 mils in diameter and having 8-11 mil holes. The core mat 12 is affixed to a stainless steel mounting plate (not shown) using magnetic strips to secure the core mat 12 thereto, which mounting plate is, in turn, clamped onto, and conformed to, the concave shape of the jig 10. The copper wires running in the direction of arrow 14 are then pulled taut so as to cause them to rise to the top of the hole in each core due to the concavity of the jig 10 and to enable a second set of 3 mil copper wires to be strung thereunder in a direction normal to the arrow 14. The jig 10 can be driven in the direction of the arrow 14 by the motor 11 so as to present a succession of sets of rows of cores to be strung.

The wire stringer as shown in FIGS. 1 and 4 includes as the major elements thereof, in addition to the jig 10, capture plate tables 16 and 18, needle drive rollers 20 and 22 and their associated motors 21 and 23, carriers 24 and 26 and their associated clamps 28 and 30, tensioners 32 and 34 and their respective motors 33 and 35, and platforms 36 and 38. The carriers 24 and 26 and the tensioners 32 and 34 may be moved toward and away from the jig 10 as indicated by the arrows 41, the tensioners being driven by motors 37 and 39. The wires to be strung are initially provided on spool 13 with needles butt welded to the ends of the wires so as to provide a flexible yet rigid end to the wires for the wiring process. The wires, as stated above, are made out of copper with a 3 mil diameter and, for a particular core mat, are 8 feet in length. The needles are made out of steel with a 3 mil diameter and are 30 inches in length. The needles may be pre-aligned by insertion through a dummy core path so that, for example, 128 needles are aligned in a plane for simultaneous insertion into sets of 128 rows of cores in the core mat 12.

In FIG. 2, a capture plate and guide for use in the present invention is shown. The capture plate 40 comprises a plastic or metal plate 42 approximately 30 mils in thickness and having, for example, 128 parallel grooves 44 therein of a depth and width sufficient to contain the needles therein. A tape 46 is provided, which may be a magnetic tape where the plate 42 is metallic, which secures itself to the top surface of the plate 42 so as to completely cover the grooves 44, thus forming a set of enclosed channels into which the needles may be inserted and from which the needles may be removed by merely removing the tape 46. The grooves 44, which for a 3 mil needle may have an 8 mil depth and a 6 mil diameter, are spaced so as to match the spacing of the rows of cores on the core mat 12 and are 1.6 inches in length. The plate 40, as described hereafter, is used both in guiding the needles into the core mat 12 and in capturing the needles as they leave the core mat 12. A needle clamp 48 shown in FIG. 3 is used to assist in the capturing of the needles. The needle clamp 48 comprises upper and lower members 49 and 51 which have rubber pads 53 affixed thereto and bolts 55 for tightening the clamp to secure the tips of the needles therebetween after they have passed through the capture plate 40, as described hereafter.

In the operation of the present invention the needles 57 which are butt welded to the wires 58 at point 61 are guided into the capture plate 40 and the capture plate 40 is then locked onto the capture plate table 16 in alignment with the rows of cores on the core mat 12. The needles 57 are then clamped onto the carrier 24 with the carrier clamp 28 securing the needles 57 approximately 1 inch from the butt weld at point 61. A second capture plate 40' is then locked onto the capture plate table 18 in alignment with those rows of cores into which the needles 57 will be fed. The roller 20 is then activated by motor 21 and a slight finger pressure is applied to the needles 57 which go over the roller 20 to drive the needles into the core mat 12. Since the carrier 24 is able to travel toward and away from the jig 10 the carrier 24 moves towards the jig 10 as the needles 57 are driven through the core mat 12. As is shown in FIG. 4, the needles 57 leave the core mat 12 and enter the capture plate 40' which is identical to the capture plate 40, the capture plate 40' having been aligned previously with the core mat 12 as stated above. The tips of the needles 57 are driven to extend slightly beyond the capture plate 40' and are then clamped with the needle clamp 48. Carrier clamp 28 is then released and tensioner 34 is moved toward the jig 10 by means of the motor 39. The needles 57 are also removed from the capture plate 40 on capture plate table 16 by removing tape 46 and disengaging the needles 57 from the plate 42.

The capture plate 40' and the needle clamp 48 are then removed from the capture plate table 18 and, as shown in FIG. 5, are placed on the bracket 56 accomanying the tensioner 34. In this procedure the capture plate 40' and the needle clamp 48 are placed through the carrier 26 and the roller guide 50, over the tension bar 52 and the guide roller 54 and under the tensioner 34 onto the bracket 56, with the guide roller 50, the tension bar 52 and the guide roller 54 being initially swung away and then placed back in tension position. The carrier clamp 30 associated with the carrier 26 remains in an unclamped position during this procedure. Motor 39 is then activiated to move tensioner 34 away from the jig 10 to near its end of travel approximately 4 feet from the center of the jig 10. The carrier plate 40' and the needle clamp 48 are then removed from the bracket 56 and placed over the tensioner 34, swinging away guide roller 58 to allow the capture plate 40' and the needle clamp 48 to pass thereunder. The guide roller 58 is then swung back and the tensioner 34 is moved half way towards the jig 10 by the motor 39 with the motor 35 activating the circular motion of the tensioner 34 to cause the needles 57 and the wire 59 to pass therearound and allow the capture plate 40' and the needle clamp 48 to be placed onto the platform 38, the platform 38 holding the capture plate 40' and the needle clamp 48 by means of pneumatic force. The final position of the needles 57, the wire 59, the capture plate 40' and the needle clamp 48 at this point in the procedure is shown in FIG. 6.

Tensioner 34 is then moved away from the jig 10 until 1 foot of the wires 58 remains on the spool 13. At this point the dummy core patch 15 is slid down to the spool 13, and the wires 59 are taped off in front of the dummy core patch 15 and are cut off while the wires 59 are manually kept under tension by holding the taped wires. Motor 39 for tensioner 34 is then reactivated to continue moving tensioner 34 away from the jig 10 until the dummy core patch 15 is approximately 5 inches away from the jig 10, at which point the wires 59 and the dummy core patch 15 are taped to the side of jig 10. The wires 59 are then slid to the side of carrier 26, the roller guide 50 is swung up and the wires 59 are removed and tied together in a bundle. The jig 10 and the core mat 12 are then moved a preselected distance in the direction of arrow 14 so that a second set of rows of ferrite cores are in place for the stringing operation. Capture plate 40 which was previously removed from the wires 59 is then placed on the capture plate table 16 and aligned to the core mat 12 to receive the next group of wires to be strung through such core mat 12. The needles 57 are then clamped approximately 1 inch before the butt weld at point 61 onto the carrier 26 by the carrier clamp 30. Capture plate 40' and needle clamp 48 are the removed from the platform 38 and placed on the capture plate table 18, the needle clamp 48 then being removed and the capture plate 40' and the needles 57 being aligned with the core mat 12. The position of the wires 58 and the needles 57 at this stage of the procedure is shown in FIG. 7.

Rollers 22 are then activated and a slight finger pressure is applied against the needles 57 to drive the needles 57 through the core mat 12 and into the capture plate 40 on the capture plate table 16. The needles are then clamped with a needle clamp 48' which is substantially identical to the needle clamp 48 and the carrier clamp 30 associated with the carrier 26 is then released.

Following a similar procedure as previously described, the capture plate 40 and the needle clamp 48' are placed through the carrier 24 and the guide roller 60, the carrier clamp 28 remaining unclamped, and onto the bracket 66 associated with the tensioner 32, with the tension bar 62 and the guide roller 64 being initially swung out of position and then back into position. During this time, motors 35 and 39 are activated to allow tensioner 34 to move towards the jig 10 while keeping tension on the wires 59. Motor 37 is then activated to move tensioner 32 away from the jig 10, with tensioner 34 moving toward the jig 10, until the tensioner 32 reaches its maximum position away from the jig 10. Capture plate 40 and needle clamp 48' are then removed from the bracket 66 and passed over the tensioner 32 and under the guide roller 68. Tensioner 32 is then moved toward the jig 10 and the capture plate 40 and the needle clamp 48' are then mounted onto the platform 36 where they are held with pneumatic force, with the tensioner 34 still moving toward the jig 10 during this procedure and motors 33, 35 and 39 being activated to keep tension on the wires 59. The tensioner 32 is then moved away from the jig 10 until the tensioner 34 reaches almost its closest position towards the jig 10 approximately 1 foot away from the center of the jig 10. At this point the wires 59 are removed from the tensioner 34 by swinging the guide roller 50 on the carrier 26 out of position, opening the capture plate 40', opening the guide rollers 54 and 58 and the tension bar 52 and placing wooden rod between the wires 59 and the tensioner 34. With the wires 59 being looped around the wooden rod, the tensioner 32 is then moved away from the jig 10 until a wire loop having a preselected size is produced, the wire loop being formed by the wires 59 exiting from one set of cores and then re-entering the core mat 12 at a position one set of cores removed along the core mat 12.

In order to initiate the next stringing step, the wires 59 are slid to the side of the carrier 24, the guide roller 60 swung out of position and the wires 59 removed and tied in a bundle. The jig 10 and the core mat 12 are then moved to present the next set of rows of cores through which the needles 57 are to be passed and the capture plate 40' is placed on the capture plate table 18 and aligned to the core mat 12 at such next set of rows of cores. The needles 57 are then clamped approximately 1 inch before the butt weld on the carrier 24 by the carrier clamp 28 and the capture plate 40 and the needle clamp 48' is removed from the platform 36 and placed on the capture plate table 16 with the needle clamp 48' then being removed and the needles 57 and the capture plate 40 being aligned with the sets of rows of cores on the core mat 12. The rollers 20 are then activated to drive the needles 57 through the core mat 12 and the capture plate 40'. The needles 57 are then clamped with the needle clamp 48 and the carrier clamp 28 is released so that the capture plate 40' and the needle clamp 48 can again be removed and placed on the bracket 56 of the tensioner 34. The procedure just described and the procedure described in conjunction with FIGS. 5, 6 and 7 is then repeated until the needles 57 and the wires 59 are successively and continuously turned through the sets of rows of cores in the core mat 12 until all of the desired rows of cores have been wired.

Having thus decribed the invention, it is obvious that numerous modifications and departures may be made by those skilled in the art; thus, the invention is to be construed as being limited by the spirit and scope of the appended claims. We claim:

1. A device for stringing a multiplicity of wires through an array in a plurality of directions comprising:
    means for holding said wires in a preselected configuration;
    means for driving said wires through said array in a first direction;
    means for capturing said wires leaving said array in said first direction;
    means for providing tension on said wires leaving said array in said first direction and for redirecting said wires to pass through said array in a second direction;
    means for driving said wires in said second direction;
    means for capturing said wires leaving said array in said second direction; and
    means for providing tension on said wires leaving said array in said second direction and redirecting said wires to pass through said array in said first direction.

2. A device for stringing a multiplicity of wires through a memory array in a plurality of directions comprising:
    means for guiding said wires through said array in a first direction;
    means for capturing said wires leaving said array in said first direction;
    means for providing tension on said wires leaving said array in said first direction and for redirecting said wires to pass through said array in a second direction;
    means for guiding said wires through said array in said second direction;
    means for capturing said wires leaving said array in said second direction; and
    means for providing tension on said wires leaving said array in said second direction and redirecting said wires to pass through said array in said first direction.

3. The device of claim 2 wherein said guiding means includes a plate having a multiplicity of grooves therein for receiving said wires and detachable means for covering said grooves to contain said wires and to permit said wires to be removed upon the detachment thereof.

4. The device of claim 3 wherein said guiding means further includes means for releasably and adjustably holding said plate adjacent to said array.

5. The device of claim 3 wherein said wires have needles attached to the ends thereof and said guiding means initially receives said needles.

6. The device of claim 5 wherein said guiding means further includes releasably engagable carrier means adapted to engage and secure said needles while said needles are guided into said array.

7. The device of claim 2 wherein said means for guiding said wires includes means for driving said wires through said array.

8. The device of claim 2 wherein said means for capturing said wires leaving said array includes a plate having a multiplicity of grooves therein for receiving said wires and detachable means for covering said grooves to contain said wires and to permit said wires to be removed upon the detachment thereof and means for releasably clamping the ends of said wires leaving said grooved plate.

9. The device of claim 2 wherein said means for providing tension on said wires and for directing and causing said wires to pass through said array includes a plurality of tensioners for receiving and guiding said wires and operable for movement toward and away from said array and means for releasably holding said capture means.

10. The device of claim 2 further comprising means for selectively moving said array.

* * * * *